(12) United States Patent
Liao et al.

(10) Patent No.: US 11,624,759 B1
(45) Date of Patent: Apr. 11, 2023

(54) INSPECTING DEVICE AND ITS TESTING SOCKET

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Chih-Chieh Liao, Hsinchu (TW); Chih-Feng Cheng, Hsinchu (TW); Yu-Min Sun, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/654,234

(22) Filed: Mar. 9, 2022

(30) Foreign Application Priority Data

Nov. 23, 2021 (TW) .................................. 110143468

(51) Int. Cl.
| | | |
|---|---|---|
| *G01R 1/02* | (2006.01) | |
| *G01R 1/04* | (2006.01) | |
| *G01R 1/067* | (2006.01) | |
| *G01R 1/073* | (2006.01) | |
| *G01R 31/26* | (2020.01) | |
| *G01R 31/28* | (2006.01) | |

(Continued)

(52) U.S. Cl.
CPC ......... *G01R 1/0483* (2013.01); *G01R 1/0416* (2013.01); *G01R 31/2887* (2013.01)

(58) Field of Classification Search
CPC . G01R 1/02; G01R 1/04; G01R 1/067; G01R 1/073; G01R 1/0416; G01R 1/0483; G01R 31/02; G01R 31/26; G01R 31/28; G01R 31/2884; G01R 31/2886; G01R 31/2887; G01R 31/31; G01R 27/20; H01R 12/00

See application file for complete search history.

(56) References Cited

U.S. PATENT DOCUMENTS

| | | | | |
|---|---|---|---|---|
| 7,950,927 | B2 * | 5/2011 | Kazama ............... | G01R 1/0466 324/755.05 |
| 10,161,964 | B2 * | 12/2018 | Miyagawa ........... | G01R 1/0466 |
| 2017/0059611 | A1 * | 3/2017 | Lesnikoski ............ | G01R 1/045 |

FOREIGN PATENT DOCUMENTS

| | | |
|---|---|---|
| TW | I452307 B | 9/2014 |
| TW | I521815 B | 2/2016 |

\* cited by examiner

*Primary Examiner* — Neel D Shah
(74) *Attorney, Agent, or Firm* — CKC & Partners Co., LLC

(57) ABSTRACT

A testing socket includes a metal block, an assembly block, an analog ground probe pin and a digital ground probe pin. The metal block is formed with a concave portion and used to connect to an independent main ground. The assembly block is electrically isolated from the metal block, and detachably embedded in the recess, so that the metal block and the assembly block are assembled together to be a probe holder. The digital grounding probe is inserted in the metal block, electrically connected to the independent main ground through the metal block. The digital ground probe pin can be electrically connected to a device to be tested (DUT) and the independent main ground. The analog ground probe pin is inserted in the assembly block, and electrically connected to the DUT and another independent main ground.

20 Claims, 8 Drawing Sheets

(51) Int. Cl.
*G01R 27/20* (2006.01)
*H01R 12/00* (2006.01)

INSPECTING DEVICE AND ITS TESTING SOCKET

RELATED APPLICATIONS

This application claims priority to Taiwan Application Serial Number 110143468, filed on Nov. 23, 2021, which is herein incorporated by reference.

BACKGROUND

Field of Disclosure

The present disclosure relates to an inspecting device and its testing socket. More particularly, the present disclosure relates to an inspecting device of a semiconductor and its testing socket.

Description of Related Art

In general, after a semiconductor package component is finished, the semiconductor package component will be inserted into a test socket so that probe pins installed in the test socket can respectively contact with electrical terminals of the semiconductor package component for electrically testing the semiconductor package component.

However, during the test for the semiconductor package component, since an analog ground and a digital ground in the test socket are connected to each other, the semiconductor package component on the test socket might be easy to connect to the analog circuit, thereby causing interference to the high-resolution analog signal of the semiconductor package component.

It is noted that the above-mentioned technology obviously still has inconvenience and defects, and needs to be further improved. Therefore, how to develop a solution to improve the foregoing deficiencies and inconvenience is an important issue that relevant persons engaged in the industry are currently unable to delay.

SUMMARY

One aspect of the present disclosure is to provide an inspecting device and its testing socket to solve the aforementioned problems of the prior art.

In one embodiment of the present disclosure, a testing socket is provided, and the testing socket includes a metal block formed with a concave portion, an assembly block electrically isolated from the metal block, an analog ground probe pin inserted in the assembly block, and a digital ground probe pin inserted in the metal block and electrically connected to the metal block. The assembly block is detachably embedded in the concave portion, so that the metal block and the assembly block are assembled together to be a probe holder for testing a device under test (DUT).

In one embodiment of the present disclosure, a testing socket is provided, and the testing socket includes a probe holder made of metal material, a socket recess recessed on a top surface of the probe holder, a power probe pin inserted in the probe holder, a digital signal probe pin inserted in the probe holder, an analog signal probe pin inserted in the probe holder, a digital ground probe pin inserted in the probe holder, and an analog ground probe pin inserted in the probe holder. The socket recess is divided into a first area and a second area which are adjacent to each other. The power probe pin is disposed in the first area, and electrically insulates from the probe holder. The digital signal probe pin is disposed in the first area, and electrically insulated from the probe holder. The digital ground probe pin is disposed in the first area, and electrically connected to the probe holder. The analog signal probe pin is disposed in the second area. The analog ground probe pin is disposed in the second area, and electrically insulated from the digital ground probe pin.

In one embodiment of the present disclosure, an inspecting device is provided, and the inspecting device includes a circuit load board and the aforementioned testing socket. The circuit load board has a first main ground and a second main ground which are insulated with each other. The metal block is electrically connected to the first main ground. The digital ground probe pin is electrically connected to the first main ground through the metal block. The digital ground probe pin is electrically connected to a device under test (DUT) and the first main ground. The analog ground probe pin is electrically connected to the DUT and the second main ground.

Thus, through the construction of the embodiments above, by isolating the analog ground and the digital ground, the signal interference and electromagnetic interference caused by high-resolution analog signals of the semiconductor package components are reduced.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
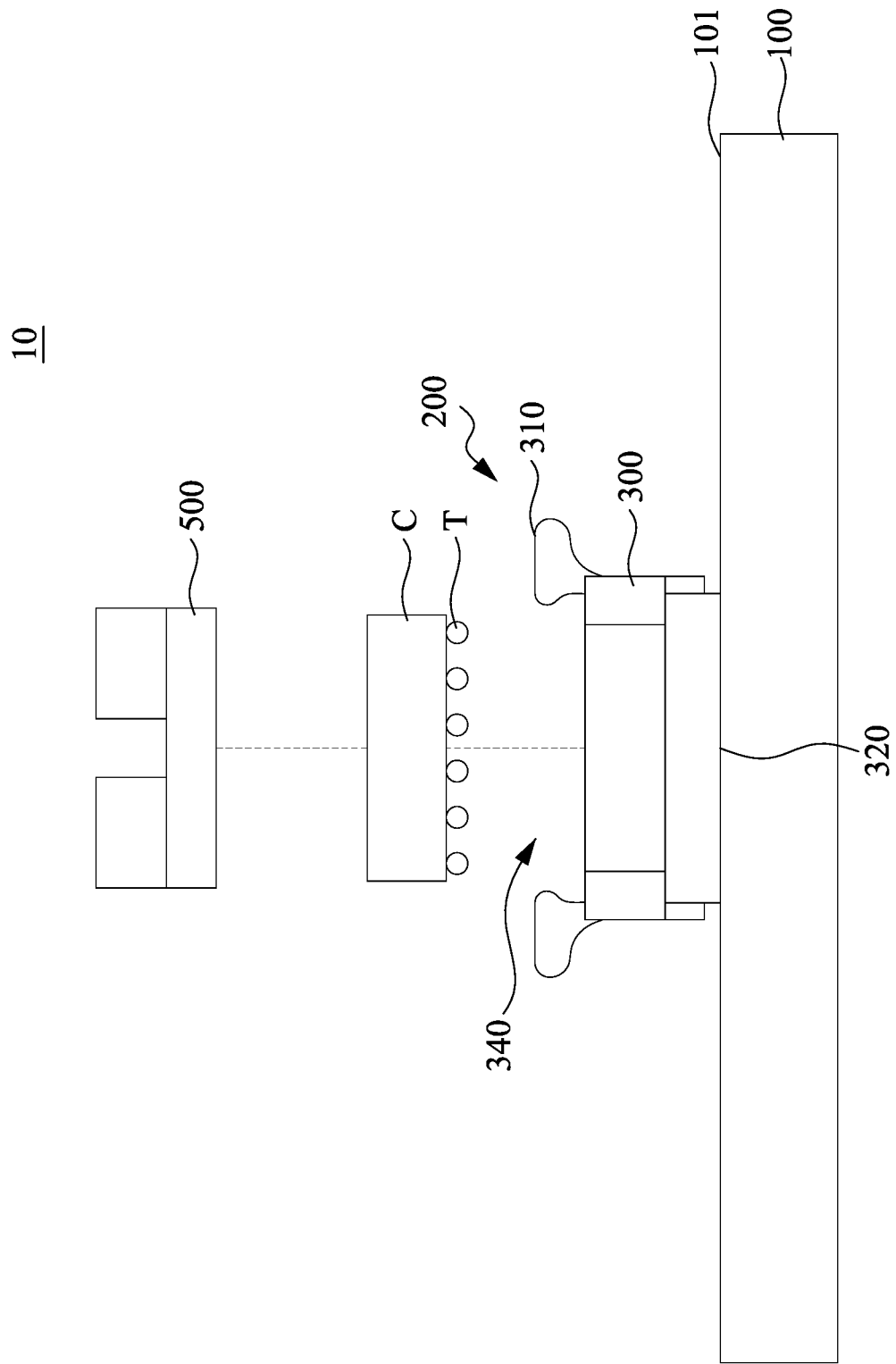
FIG. 1 is a schematic view of an inspecting device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
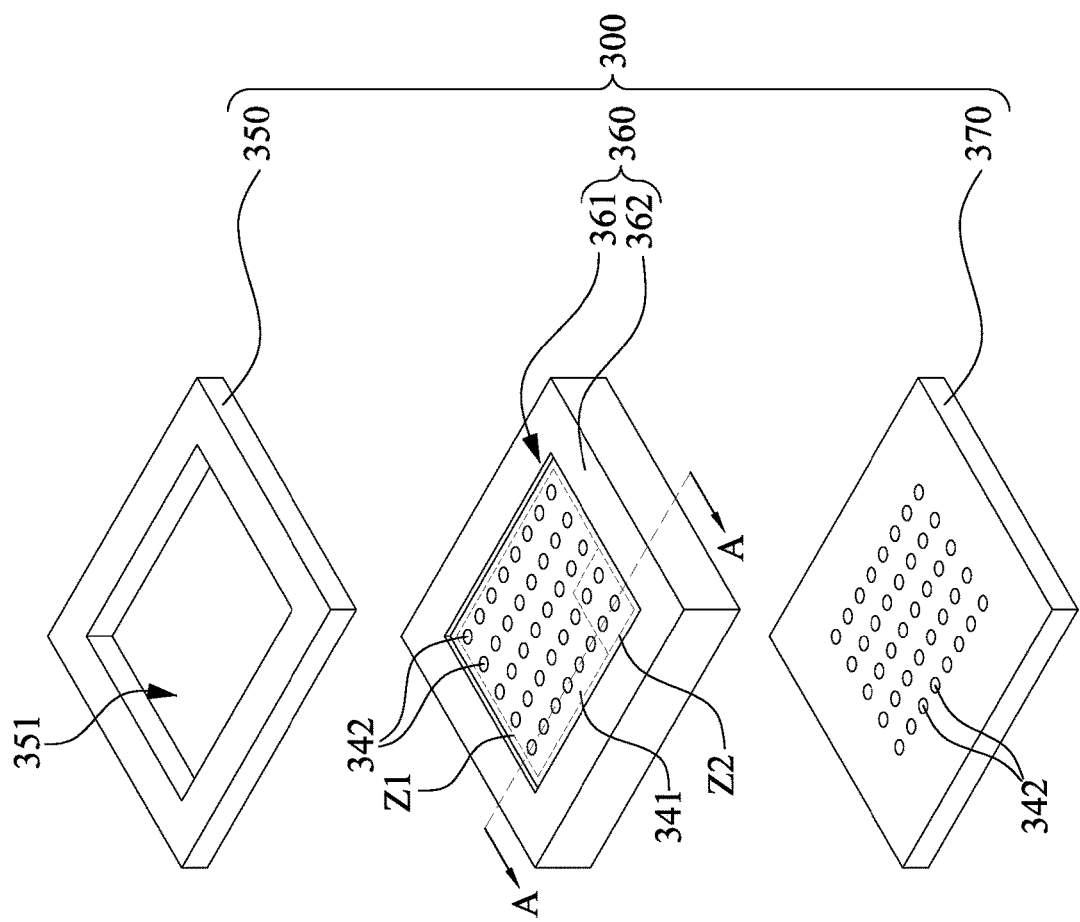
FIG. 2 is an exploded view of the testing socket of FIG. 1.
Figure 3:
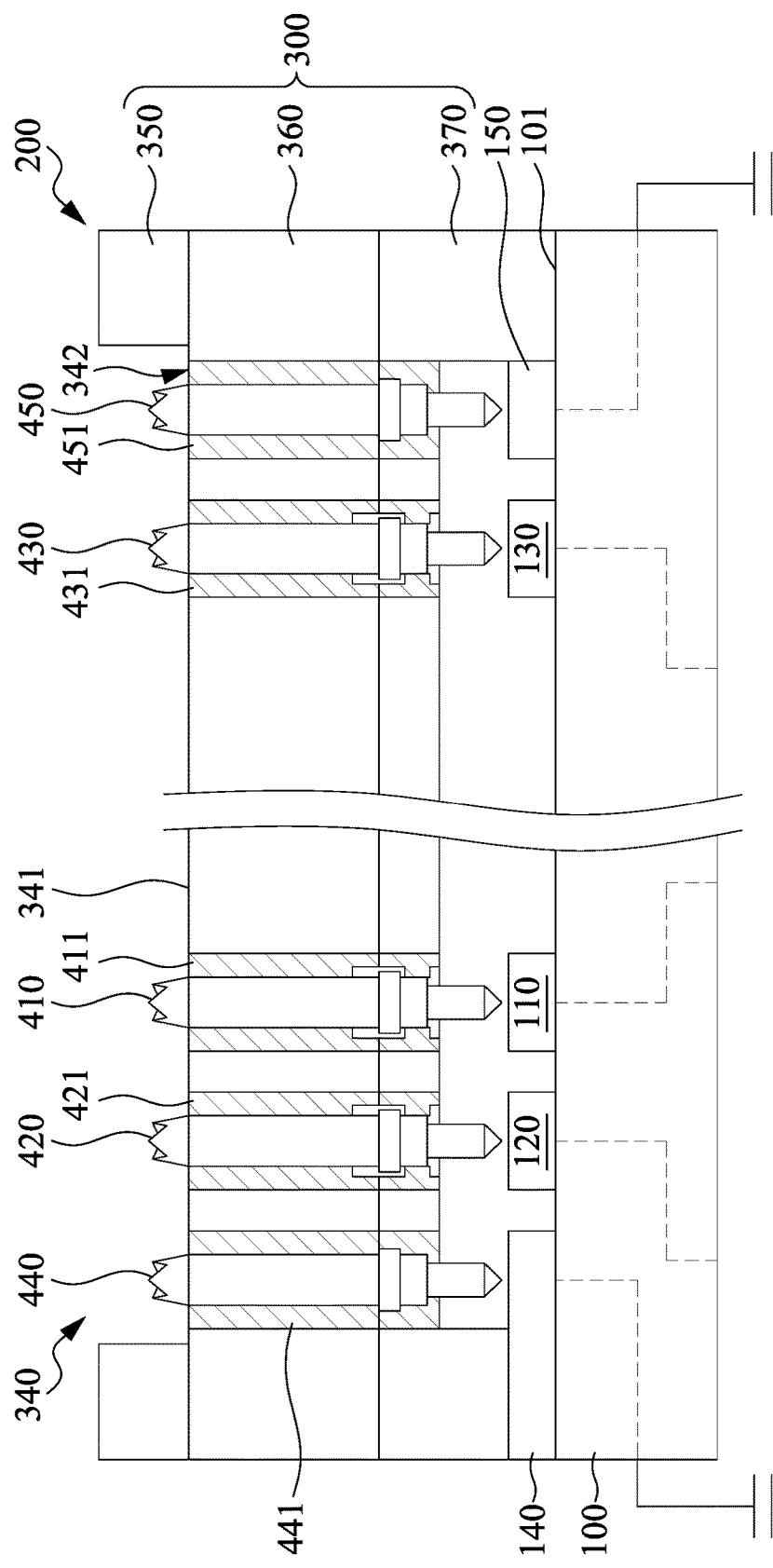
FIG. 3 is a partial cross-sectional view of the testing socket viewed along a line A-A of FIG. 2.

Reference is now made to FIG. 1 to FIG. 3, in which FIG. 1 is a schematic view of an inspecting device 10 according to one embodiment of the present disclosure, FIG. 2 is an exploded view of the testing socket 200 of FIG. 1, and FIG. 3 is a partial cross-sectional view of the testing socket 200 viewed along a line A-A of FIG. 2. As shown in FIG. 1 to FIG. 3, the inspecting device 10 includes a circuit load board 100, a testing socket 200 and a socket lid 500. A top surface 101 of the circuit load board 100 is provided with at least one power contact 110, at least one digital signal contact 120, at least one analog signal contact 130, at least one first main ground 140 and at least one second main ground 150. The first main ground 140 and the second main ground 150 are configured independently and electrically insulated with each other.

The testing socket 200 includes a probe holder 300 having a top surface 310 and a rear surface 320 opposite to each other. The probe holder 300 is fixedly disposed on the circuit load board 100, and the probe holder 300 is electrically connected to the circuit load board 100 through the rear surface 320 of the probe holder 300, and electrically connected to the first main ground 140. The probe holder 300 is mainly made of metal material (e.g., copper) or conductive non-metallic material (e.g., graphite). The probe holder 300 is used to test a device under test (DUT) or a chip being tested (called chip C hereinafter). The DUT or the chip C, for example is a semiconductor package. More specifically, the top surface 310 of the probe holder 300 is formed with a socket recess 340. The socket recess 340 is used to receive the aforementioned chip C. A bottom surface 341 of the socket recess 340 is divided into a first area Z1 and a second area Z2. The first area Z1 and the second area Z2 are adjacent to each other, and the first area Z1 and the second area Z2 are physically separable. For example, the area of the first area Z1 is larger than the area of the second area Z2, and the second area Z2 is closer to one of edges of the socket recess 340 than the first area Z1.

The testing socket 200 further includes a plurality of power probe pins 410, a plurality of digital signal probe pins 420, a plurality of analog signal probe pins 430, a plurality of digital ground probe pins 440 and a plurality of analog ground probe pins 450. The power probe pins 410 are respectively inserted in the probe holder 300 abreast, and the power probe pins 410 are simultaneously disposed in the first area Z1. The digital signal probe pins 420 are respectively inserted in the probe holder 300 abreast, and the digital signal probe pins 420 are simultaneously disposed in the first area Z1. The digital ground probe pins 440 are respectively inserted in the probe holder 300 abreast, and are simultaneously disposed in the first area Z1. The digital ground probe pins 440 are electrically connected to the probe holder 300. The analog signal probe pins 430 are respectively inserted in the probe holder 300 abreast, and are simultaneously disposed in the second area Z2. The analog ground probe pins 450 are respectively inserted in the probe holder 300 abreast, and are simultaneously disposed in the second area Z2. The power probe pins 410, the digital signal probe pins 420, the analog signal probe pins 430, the digital ground probe pins 440 and the analog ground probe pins 450 simultaneously extend upwards to contact with the corresponding pins T of the aforementioned chip C embedded into the socket recess 340. The power probe pins 410 simultaneously extend downwards to contact with the power contacts 110 of the circuit load board 100. The digital signal probe pins 420 simultaneously extend downwards to contact with the digital signal contacts 120 of the circuit load board 100. The analog signal probe pins 430 simultaneously extend downwards to contact with the analog signal contacts 130 of the circuit load board 100. The digital ground probe pins 440 are electrically connected to the first main ground 140 of the circuit load board 100 through the probe holder 300, respectively, and the digital ground probe pins 440 extend downwards to directly contact with the first main ground 140 of the circuit load board 100. The analog ground probe pins 450 and the digital ground probe pins 440 are electrically insulated from each other, and extend downwards to directly contact with the second main ground 150 of the circuit load board 100.

More specifically, the bottom surface 341 of the socket recess 340 is formed with a plurality of through holes 342 separately distributed on the bottom surface 341 of the socket recess 340, and the through holes 342 are distributed in both of the first area Z1 and the second area Z2. Each of the through holes 342 is able to be inserted by a coaxial telescopic pogo pin (e.g., pogo pin), the coaxial telescopic pogo pin can be one of the power probe pins 410, the digital signal probe pin 420, the analog signal probe pin 430, the digital ground probe pin 440, the analog ground probe pin 450 and the like mentioned above.

Furthermore, the probe holder 300 further includes a plurality of first insulation portions 411, a plurality of second insulation portions 421, a plurality of third insulation portions 431, a plurality of first conductor portions 441 and a plurality of second conductor portions 451. Each of the first insulation portions 411 is disposed in one of the through holes 342 in the first area Z1, and surrounds one of the power probe pins 410 to be sandwiched between this power probe pin 410 and the probe holder 300 so as to electrically insulate the power probe pin 410 from the probe holder 300. Each of the second insulation portions 421 is disposed in one of the through holes 342 in the first area Z1, and surrounds one of the digital signal probe pins 420 to be sandwiched between this digital signal probe pin 420 and the probe holder 300 so as to electrically insulate the digital signal probe pin 420 from the probe holder 300. Each of the third insulation portions 431 is disposed in one of the through holes 342 in the second area Z2, and surrounds one of the analog signal probe pins 430 to be sandwiched between this analog signal probe pin 430 and the probe holder 300 so as to electrically insulate the analog signal probe pin 430 from the probe holder 300. One of the first conductor portions 441 is disposed in one of the through holes 342 in the first area Z1, surrounds one of the digital ground probe pins 440 to be sandwiched between this digital ground probe pin 440 and the probe holder 300 so that this digital ground probe pin 440 is electrically connected to the probe holder 300 through this first conductor portions 441. However, the disclosure is not limited to this, and in other embodiments, the digital ground probe pin 440 may also be directly contacted with the inner wall of the corresponding through hole 342 of the probe holder 300. One of the second conductor portions 451 is disposed in one of the through holes 342 in the second area Z2, surrounds one of the analog ground probe pins 450 to be sandwiched between this analog ground probe pin 450 and the probe holder 300 so that the analog ground probe pin 450 is electrically connected to the probe holder 300 through this second conductor portion 451. However, the disclosure is not limited to this, and in other embodiments, the analog ground probe pin 450 may also be directly contacted with the inner wall of the corresponding through hole 342 of the probe holder 300.

In this embodiment, the probe holder 300 includes a front frame 350, a metal plate body 360 and a supporting bottom plate 370. The metal plate body 360 is directly sandwiched between the front frame 350 and the supporting bottom plate 370. The front frame 350 is formed with an opening 351, and the opening 351 of the front frame 350 and the metal plate body 360 are collectively defined to be the above-mentioned socket recess 340. Each of the above-mentioned through holes 342 is simultaneously formed on the metal plate body 360 and the supporting bottom plate 370, and both of the first area Z1 and the second area Z2 are located on the metal plate body 360. Furthermore, the metal plate body 360 has a hole-arrangement area 361 and a surrounding area 362. The surrounding area 362 completely surrounds the hole-arrangement area 361. The above-mentioned through holes 342 all located in the hole-arrangement area 361, and not in the surrounding area 362. The second area Z2 is located on both of the hole-arrangement area 361 and the surrounding area 362, and the first area Z1 is the remaining area in the hole-arrangement area 361 except the second area Z2.

The socket lid 500 covers the socket recess 340 of the probe holder 300 and the aforementioned chip C in the socket recess 340 to ensure that the corresponding terminals T of the aforementioned chip C can reliably touch the corresponding probes.

Figure 4:
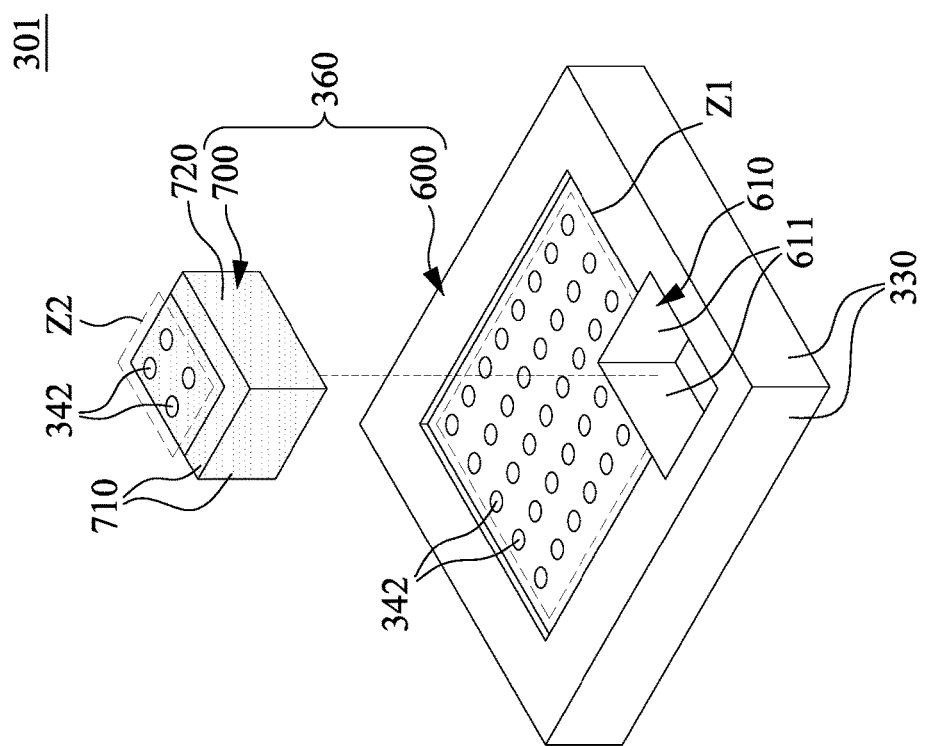
FIG. 4 is a partial exploded view of the probe holder of FIG. 2.

FIG. 4 is a partial exploded view of the probe holder 301 of FIG. 2. As shown in FIG. 4, more specifically, in the embodiment, the probe holder 301 further includes a metal block 600 and an assembly block 700. The metal block 600 is connected to the first main ground 140, and the metal block 600 is formed with a concave portion 610. The assembly block 700 is detachably embedded in the concave portion 610 so that the metal block 600 and the assembly block 700 can be assembled together to restore as one part (e.g., metal plate body 360) of the aforementioned probe holder 301, and all outer lateral surfaces 330 of the probe holder 301 completely surround the assembly block 700.

It is noted, as shown in FIG. 3 and FIG. 4, the power probe pins 410, the digital signal probe pins 420 and the digital ground probe pins 440 described above are disposed in the metal block 600, and the analog signal probe pins 430 and the analog ground probe pins 450 described above are disposed in the assembly block 700.

Also, the assembly block 700 is electrically insulated from the metal block 600 and the circuit load board 100, respectively, so that the above-mentioned digital ground probe pins 440 and the above-mentioned analog ground probe pins 450 are not electrically connected to each other, nor connected to the same main ground. More specifically, all of outer surfaces 710 of the assembly block 700 are completely covered by an anodizing treatment layer 720. The anodizing treatment layer 720 refers to an oxide film formed on all of the outer surfaces 710 of the assembly block 700. The anodizing treatment layer 720 has high hardness, corrosion resistance, oxidation resistance, wear resistance and electrical insulation. For example, the assembly block 700 is made of metal material (e.g., copper) or conductive non-metallic material (e.g., graphite). The assembly block 700 is pre-processed by a hard film anodizing, so that all of the outer surfaces of the assembly block 700 which are exposed outwardly are subjected to electric current in the electrolyte so as to form the above-mentioned anodizing treatment layer 720.

In addition, more specifically, the size of the assembly block 700 matches the size of the concave portion 610, so that the assembly block 700 can completely fill into the concave portion 610 so as to completely veal the concave portion 610, that is, the inner surfaces 611 of the concave portion 610 are directly contacted with the above-mentioned anodizing treatment layer 720 of the assembly block 700.

Figure 5:
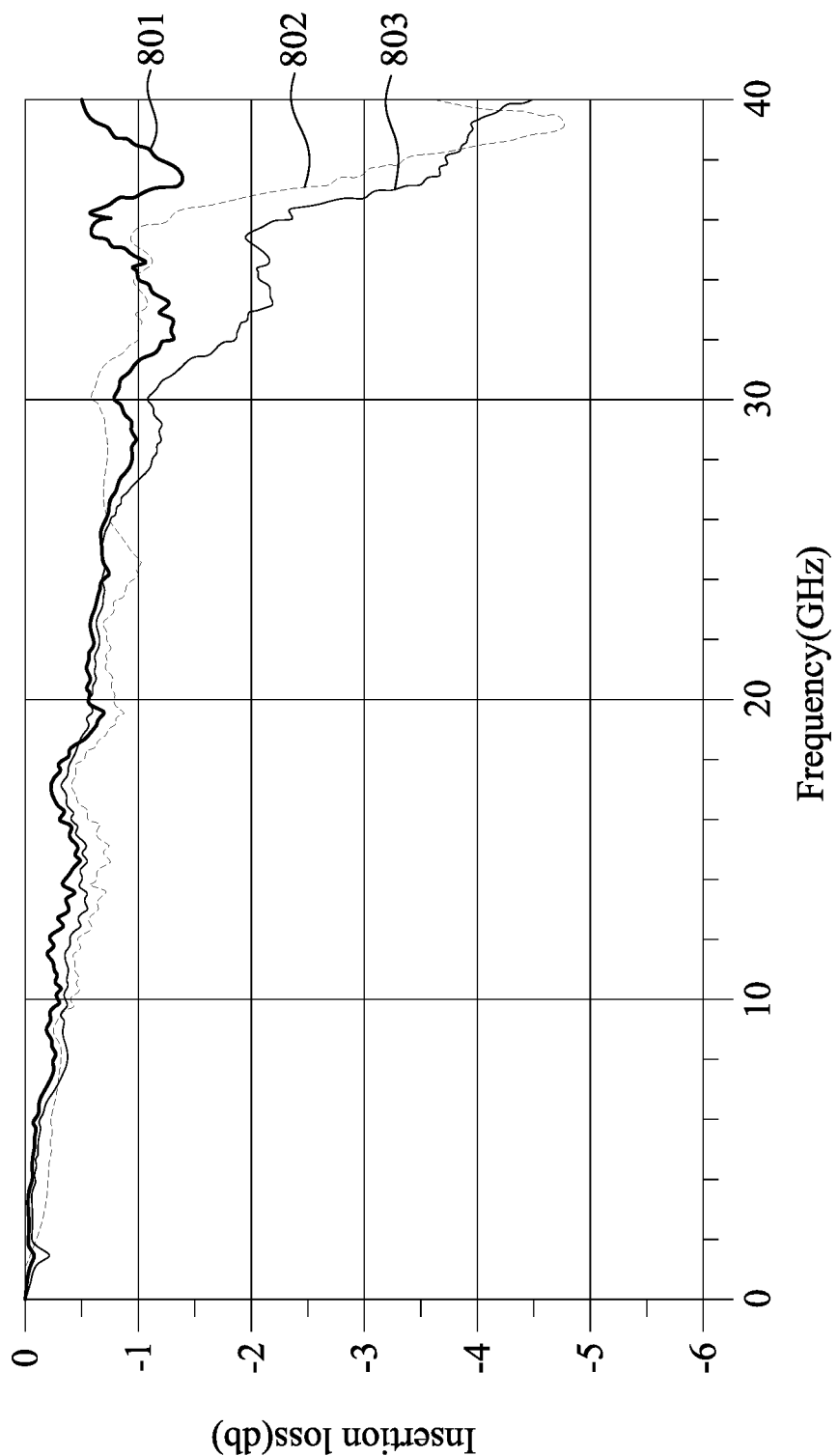
FIG. 5 is a performance correlation graph of insertion loss of testing sockets of different designs.

FIG. 5 is a performance correlation graph of insertion loss of testing sockets of different designs. The applicant performed an insertion loss test to three testing sockets with different designs (referred to as first to third testing sockets 801 to 803 hereinafter) in which all of ground probe pins of the first testing socket 801 are all electrically connected to the probe holder, all of ground probe pins of the second testing socket 802 are all electrically insulated from the probe holder, and a part (i.e., the digital ground probe pins 440 of the aforementioned embodiment, FIG. 3) of ground probe pins of the third testing socket 803 is electrically connected to the probe holder, and another part (i.e., the analog ground probe pins 450 of the aforementioned embodiment, FIG. 3) of the ground probe pins of the third testing socket 803 is electrically insulated from the probe holder.

Thus, as shown in FIG. 5, in the range of 30 to 40 GHz, the insertion loss of the first testing socket 801 is gradually increased to the highest of them, the insertion loss of the second testing socket 802 is next, and the insertion loss of the third testing socket 803 is the lowest. Thus, the testing socket 200 of the above-mentioned embodiment able to obtain less insertion loss during testing can be told from FIG. 5.

Figure 6:
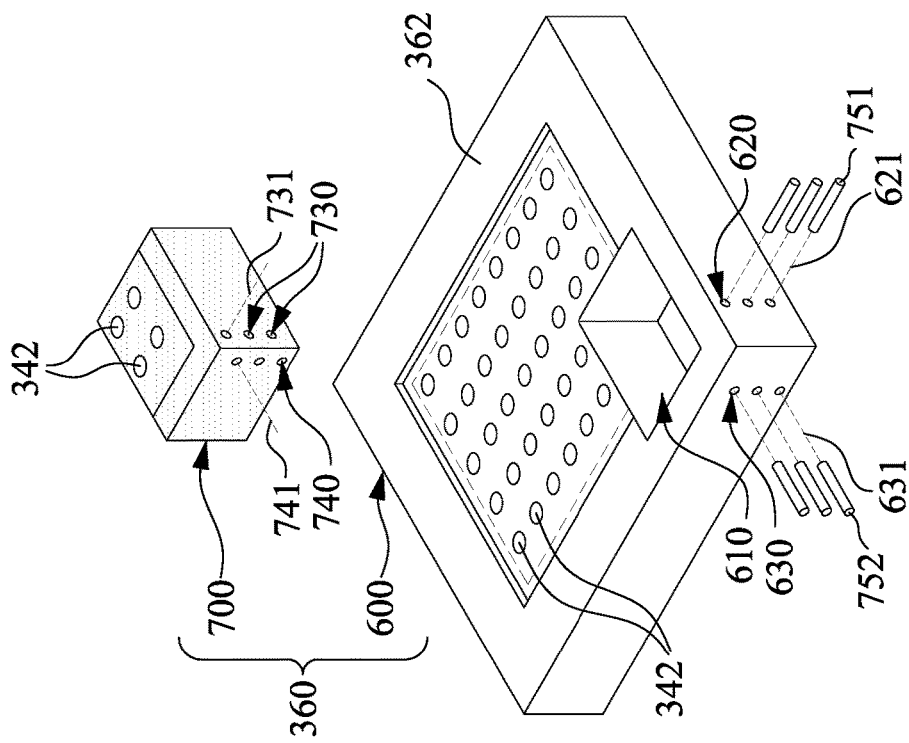
FIG. 6 is a partial exploded view of the probe holder according to one embodiment of the present disclosure.

FIG. 6 is a partial exploded view of the probe holder 302 according to one embodiment of the present disclosure. As shown in FIG. 6, the metal block 600 is formed with a plurality of first fixing holes 620 and a plurality of second fixing holes 630. The first fixing holes 620 are linearly arranged on one of two adjacent outer lateral surfaces 330 of the metal block 600, and the second fixing holes 630 are linearly arranged on the other of the adjacent outer lateral surfaces 330 of the metal block 600. An axis 621 of each of the first fixing holes 620 and an axis 631 of each of the second fixing holes 630 are intersected with each other, and the first fixing holes 620 and the second fixing holes 630 are not coplanar.

The assembly block 700 is formed with a plurality of third fixing holes 730 and a plurality of fourth fixing holes 740. The third fixing holes 730 are linearly arranged on one of two adjacent outer surfaces of the assembly block 700, and the fourth fixing holes 740 are linearly arranged on the other of the adjacent outer surfaces of the assembly block 700. An axis 731 of each of the third fixing holes 730 and an axis 741 of each of the fourth fixing holes 740 are intersected (e.g., orthogonal) with each other, and the third fixing holes 730 and the fourth fixing holes 740 are not coplanar. It is noted, the first fixing holes 620 to the fourth fixing holes 740 are all located in the above-mentioned surrounding area 362 of the probe holder 302, and not to be configured into the hole-arrangement area 361.

Thus, when the assembly block 700 is embedded into the concave portion 610 so that the assembly block 700 and the metal block 600 are assembled together to be the part (e.g., metal plate body 360) of the aforementioned probe holder 302, one of the first fixing holes 620 and one of the third fixing holes 730 are coaxial with each other, one of the second fixing holes 630 and one of the fourth fixing holes 740 are coaxial with each other, next, the assembly block 700 can be fixed on the metal block 600 by one of the first fixing pins 751 passing through the corresponding first fixing hole 620 and the corresponding third fixing hole 730, and one of the second fixing pins 752 passing through the corresponding second fixing hole 630 and the corresponding fourth fixing hole 740. For example, the first fixing pins 751 and the second fixing pins 752 respectively comprise polyetheretherketone (PEEK) material or other similar materials, and the PEEK is a semi-crystalline high-performance engineering thermoplastic. However, the disclosure is not limited to the materials of the first fixing pin 751 and the second fixing pin 752.

Figure 7:
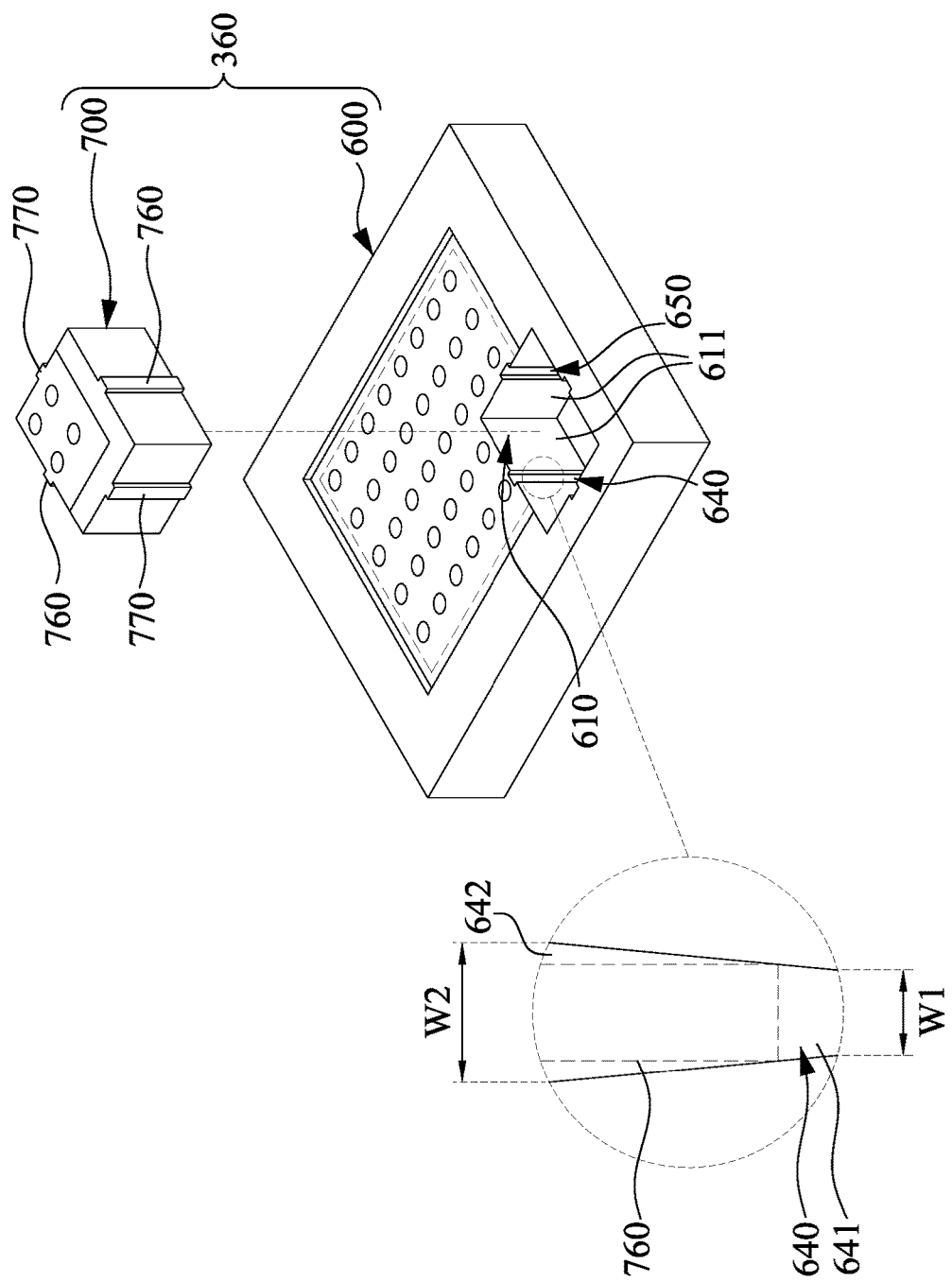
FIG. 7 is a partial exploded view of the probe holder according to one embodiment of the present disclosure.

FIG. 7 is a partial exploded view of the probe holder 303 according to one embodiment of the present disclosure. As shown in FIG. 7, the probe holder 303 of the embodiment is substantially the same as the above-mentioned probe holder 300, except that the assembly block 700 includes at least one (e.g., two) first guide rail 760 and at least one (e.g., two) second guide rail 770 which are respectively convexly formed on two adjacent outer surfaces 710 of the assembly block 700. The metal block 600 includes at least one (e.g., two) first rail groove 640 and at least one (e.g., two) second rail groove 650 which are respectively recessed on two adjacent inner surfaces 611 of the concave portion 610.

Thus, when the assembly block 700 is embedded into the concave portion 610 so that the assembly block 700 and the metal block 600 are assembled together to be the part (e.g., metal plate body 360) of the aforementioned probe holder 303, the first guide rail 760 is slidably disposed in the corresponding first rail groove 640, and the second guide rail 770 is slidably disposed in the corresponding second rail groove 650.

Furthermore, an overall width of each of the first rail grooves 640 is inconsistent, and an overall width of each of the second rail grooves 650 is inconsistent, so that the assembly block 700 can be fixed on the metal block 600 by the first guide rail 760 being stopped in the first rail groove 640 and the second guide rail 770 being stopped in the second rail groove 650. In other words, the width W1 of the first end 641 of each of the first rail grooves 640 is smaller than the width W2 of the second end 642 thereof, so that the first guide rail 760 is stopped by the first end 641 of the first rail groove 640, so that the first guide rail 760 cannot continue to slide; under the same design, the second guide rail 770 is also blocked by the second rail groove 650 and the second guide rail 770 cannot continue to slide.

Figure 8:
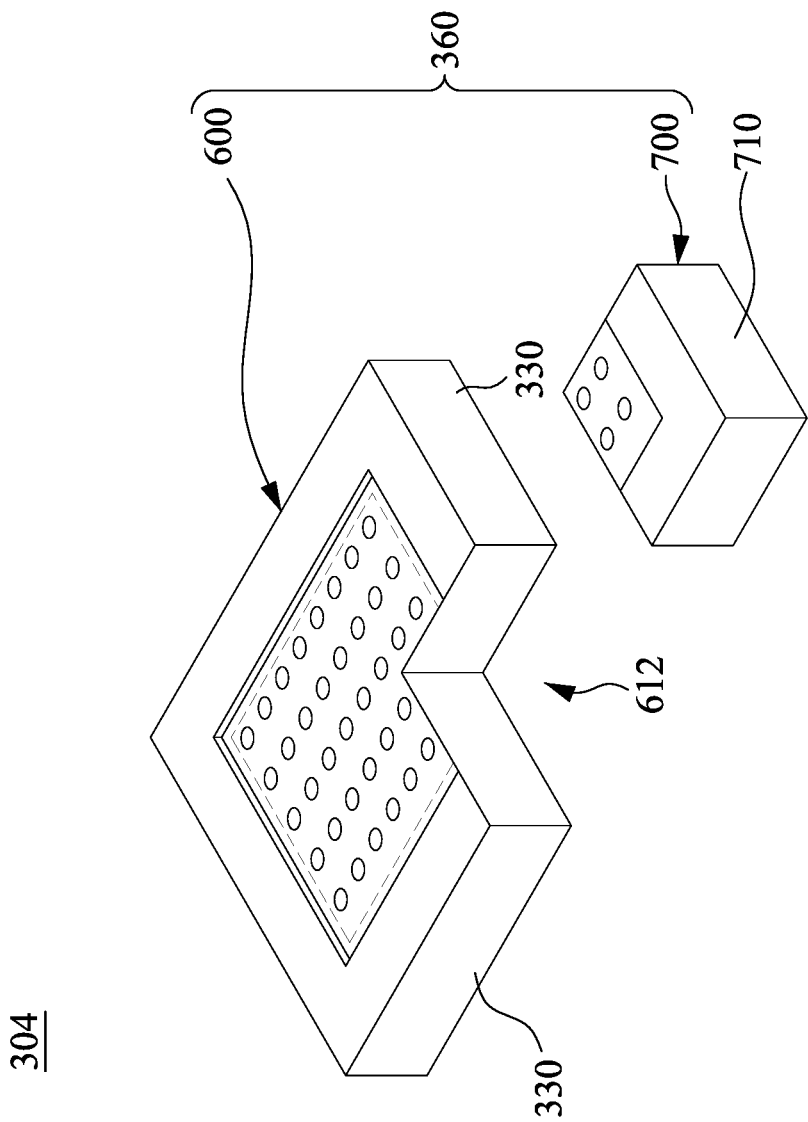
FIG. 8 is a partial exploded view of the probe holder according to one embodiment of the present disclosure.

FIG. 8 is a partial exploded view of the probe holder 304 according to one embodiment of the present disclosure. As shown in FIG. 8, the probe holder 304 of the embodiment is substantially the same as the above-mentioned probe holder 300, except that the concave portion 612 of the metal block 600 is directly connected to two adjacent outer lateral surfaces 330 of the probe holder 304, and the concave portion 612 is not a complete contour on the probe holder 304. In this way, when the assembly block 700 and the metal block 600 are assembled together to be the part (e.g., metal plate body 360) of the aforementioned probe holder 304, the outer surface 710 of the assembly block 700 is a part of the outer lateral surfaces 330 of the probe holder 304.

Thus, through the construction of the embodiments above, by isolating the analog ground and the digital ground, the signal interference and electromagnetic interference caused by high-resolution analog signals of the semiconductor package components are reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A testing socket, comprising:
   a metal block formed with a concave portion, and used to connect to an independent main ground;
   an assembly block electrically isolated from the metal block, and detachably embedded in the concave portion, so that the metal block and the assembly block are assembled together to be a probe holder for testing a device under test (DUT);
   a digital ground probe pin inserted in the metal block, electrically connected to the metal block, and electrically connected to the independent main ground through the metal block, wherein the digital ground probe pin is used to be electrically connected to the DUT and the independent main ground; and
   an analog ground probe pin inserted in the assembly block, and used to be electrically connected to the DUT and another independent main ground.

2. The testing socket of claim 1, further comprising:
   a power probe pin inserted in the metal block, and used to be electrically connected to the DUT;
   a first insulation portion surrounding the power probe pin, arranged between the power probe pin and the metal block so as to electrically insulate the power probe pin from the metal block;
   a digital signal probe pin inserted in the metal block for connecting to the DUT;
   a second insulation portion surrounding the digital signal probe pin, arranged between the digital signal probe pin and the metal block so as to electrically insulate the digital signal probe pin from the metal block;
   an analog signal probe pin inserted in the metal block for connecting to the DUT; and
   a third insulation portion surrounding the analog signal probe pin, arranged between the analog signal probe pin and the assembly block so as to electrically insulate the analog signal probe pin from the assembly block.

3. The testing socket of claim 2, wherein a front surface of the probe holder is formed with a socket recess, the socket recess is used for receiving the DUT, wherein the digital ground probe pin, the analog ground probe pin, the power probe pin, the digital signal probe pin and the analog signal probe pin are all partially exposed outwards from the socket recess.

4. The testing socket of claim 1, wherein all outer surfaces of the assembly block are completely covered by an anodizing treatment layer.

5. The testing socket of claim 1, wherein the probe holder further comprises at least one first fixing pin and at least one second fixing pin;
   the metal block is formed with at least one first fixing hole and at least one second fixing hole, wherein an axis of the first fixing hole and an axis of the second fixing hole are intersected with each other; and
   the assembly block is formed with at least one third fixing hole and at least one fourth fixing hole, wherein an axis of the third fixing hole and an axis of the fourth fixing hole are intersected with each other,
   wherein when the assembly block and the metal block are assembled together to be the probe holder, the first fixing hole and the third fixing hole are coaxial with each other, the second fixing hole and the fourth fixing hole are coaxial with each other, the first fixing pin passes through the first fixing hole and the third fixing hole, and the second fixing pin passes through the second fixing hole and the fourth fixing hole.

6. The testing socket of claim 5, wherein the at least one first fixing pin and at least one second fixing pin are made of polyetheretherketone material, respectively.

7. The testing socket of claim 1, wherein the assembly block comprises at least one first guide rail and at least one second guide rail which are respectively convexly formed on two adjacent outer surfaces of the assembly block; and the metal block comprises at least one first rail groove and at least one second rail groove, the first rail groove and the second rail groove which are respectively recessed on two adjacent inner surfaces of the metal block, wherein when the assembly block and the metal block are assembled together to be the probe holder, the first guide rail is slidably disposed in the first rail groove, and the second guide rail is slidably disposed in the second rail groove.

8. The testing socket of claim 7, wherein widths of two opposite ends of the first rail groove are inconsistent, and widths of two opposite ends of the second rail groove are inconsistent, so that the first guide rail is stopped in the first rail groove and the second guide rail is stopped in the second rail groove.

9. The testing socket of claim 1, wherein when the assembly block and the metal block are assembled together to be the probe holder, a part of outer surfaces of the assembly block is a part of outer surfaces of the probe holder; or when the assembly block and the metal block are assembled together to be the probe holder, all outer lateral surfaces of the probe holder completely surround the assembly block.

10. A testing socket, comprising:
a probe holder made of metal material, and comprising a top surface and a rear surface opposite to each other, and the rear surface is used to be electrically connected to an independent main ground;
a socket recess recessed on the top surface of the probe holder, for receiving a device under test (DUT), wherein the socket recess is divided into a first area and a second area which are adjacent to each other;
a power probe pin inserted in the probe holder, disposed in the first area, and electrically insulating from the probe holder for connecting the DUT;
a digital signal probe pin inserted in the probe holder, disposed in the first area, and electrically insulated from the probe holder for connecting the DUT;
a digital ground probe pin inserted in the probe holder, disposed in the first area, and electrically connected to the probe holder for electrically connecting to the independent main ground through the probe holder, the digital ground probe pin is used to connect to the DUT and the independent main ground;
an analog signal probe pin inserted in the probe holder, disposed in the second area for connecting the DUT; and
an analog ground probe pin inserted in the probe holder, disposed in the second area, and electrically insulated from the digital ground probe pin, wherein the analog ground probe pin is used to be connected to the DUT and another independent main ground.

11. The testing socket of claim 10, wherein the first area and the second area are physically separable.

12. An inspecting device, comprising:
a circuit load board having a first main ground and a second main ground which are insulated with each other; and
a testing socket comprising:
a metal block electrically connected to the first main ground, and formed with a concave portion;
an assembly block electrically isolated from the metal block, and detachably embedded in the concave portion, so that the metal block and the assembly block are assembled together to be a probe holder for testing a device under test (DUT);
a digital ground probe pin inserted in the metal block, electrically connected to the metal block, and electrically connected to the first main ground through the metal block, wherein the digital ground probe pin is electrically connected to the DUT and the first main ground; and
an analog ground probe pin inserted in the assembly block, and electrically connected to the DUT and the second main ground.

13. The inspecting device of claim 12, wherein the testing socket further comprising:
a power probe pin inserted in the metal block, and used to be electrically connected to the DUT;
a first insulation portion surrounding the power probe pin, arranged between the power probe pin and the metal block so as to electrically insulate the power probe pin from the metal block;
a digital signal probe pin inserted in the metal block for connecting to the DUT;
a second insulation portion surrounding the digital signal probe pin, arranged between the digital signal probe pin and the metal block so as to electrically insulate the digital signal probe pin from the metal block;
an analog signal probe pin inserted in the metal block for connecting to the DUT; and
a third insulation portion surrounding the analog signal probe pin, arranged between the analog signal probe pin and the assembly block so as to electrically insulate the analog signal probe pin from the assembly block.

14. The inspecting device of claim 13, wherein a front surface of the probe holder is formed with a socket recess, the socket recess is used for receiving the DUT, wherein the digital ground probe pin, the analog ground probe pin, the power probe pin, the digital signal probe pin and the analog signal probe pin are all partially exposed outwards from the socket recess.

15. The inspecting device of claim 12, wherein all outer surfaces of the assembly block are completely covered by an anodizing treatment layer.

16. The inspecting device of claim 12, wherein the probe holder further comprises at least one first fixing pin and at least one second fixing pin;
the metal block is formed with at least one first fixing hole and at least one second fixing hole, wherein an axis of the first fixing hole and an axis of the second fixing hole are intersected with each other; and
the assembly block is formed with at least one third fixing hole and at least one fourth fixing hole, wherein an axis of the third fixing hole and an axis of the fourth fixing hole are intersected with each other,
wherein when the assembly block and the metal block are assembled together to be the probe holder, the first fixing hole and the third fixing hole are coaxial with each other, the second fixing hole and the fourth fixing hole are coaxial with each other, the first fixing pin passes through the first fixing hole and the third fixing hole, and the second fixing pin passes through the second fixing hole and the fourth fixing hole.

17. The inspecting device of claim 16, wherein the first fixing pin and the second fixing pin are made of polyetheretherketone material, respectively.

18. The inspecting device of claim 12, wherein the assembly block comprises at least one first guide rail and at least one second guide rail which are respectively convexly formed on two adjacent outer surfaces of the assembly block; and the metal block comprises at least one first rail groove and at least one second rail groove, the first rail groove and the second rail groove which are respectively recessed on two adjacent inner surfaces of the metal block, wherein when the assembly block and the metal block are assembled together to be the probe holder, the first guide rail is slidably disposed in the first rail groove, and the second guide rail is slidably disposed in the second rail groove.

19. The inspecting device of claim 18, wherein widths of two opposite ends of the first rail groove are inconsistent, and widths of two opposite ends of the second rail groove are inconsistent, so that the first guide rail is stopped in the first rail groove and the second guide rail is stopped in the second rail groove.

20. The inspecting device of claim 12, wherein when the assembly block and the metal block are assembled together to be the probe holder, a part of outer surfaces of the assembly block is a part of outer surfaces of the probe holder; or when the assembly block and the metal block are assembled together to be the probe holder, all outer lateral surfaces of the probe holder completely surround the assembly block.

* * * * *